US010609840B2

(12) United States Patent
Gao et al.

(10) Patent No.: US 10,609,840 B2
(45) Date of Patent: Mar. 31, 2020

(54) MODULAR QUICK-RELEASE LIQUID HEAT REMOVAL COUPLING SYSTEM FOR ELECTRONIC RACKS

(71) Applicant: Baidu USA LLC, Sunnyvale, CA (US)

(72) Inventors: Tianyi Gao, Santa Clara, CA (US); Yan Cui, San Jose, CA (US); Shuai Shao, Binghamton, NY (US); Charles J. Ingalz, San Jose, CA (US); Ali Heydari, Albany, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 220 days.

(21) Appl. No.: 15/490,272

(22) Filed: Apr. 18, 2017

(65) Prior Publication Data
US 2018/0303007 A1 Oct. 18, 2018

(51) Int. Cl.
*H05K 7/20* (2006.01)
*H05K 7/14* (2006.01)

(52) U.S. Cl.
CPC ..... *H05K 7/20272* (2013.01); *H05K 7/20781* (2013.01)

(58) Field of Classification Search
CPC .............. H05K 7/20272; H05K 7/20781
See application file for complete search history.

(56) References Cited

U.S. PATENT DOCUMENTS

| | | | | |
|---|---|---|---|---|
| 7,639,499 B1* | 12/2009 | Campbell | .......... | H05K 7/20772 165/104.19 |
| 2004/0008483 A1* | 1/2004 | Cheon | ........................ | G06F 1/20 361/679.53 |
| 2004/0221604 A1* | 11/2004 | Ota | ..................... | H05K 7/20781 62/259.2 |
| 2007/0274043 A1* | 11/2007 | Shabany | ............ | H05K 7/20645 361/696 |
| 2010/0290190 A1* | 11/2010 | Chester | .............. | H05K 7/20772 361/701 |
| 2011/0219803 A1* | 9/2011 | Park | .......................... | F24F 1/26 62/238.6 |
| 2011/0219804 A1* | 9/2011 | Park | .......................... | F24F 1/26 62/259.1 |

(Continued)

*Primary Examiner* — Timothy J Thompson
*Assistant Examiner* — Michael A Matey
(74) *Attorney, Agent, or Firm* — Womble Bond Dickinson (US) LLP

(57) ABSTRACT

An electronic rack includes a heat removal liquid manifold, a number of server slots, and a number of server blades inserted therein. The liquid manifold distributes heat removal liquid from an external heat removal system to remove heat from the server blades. Each server blade includes a server tray to contain information technology (IT) components and a quick-release coupling assembly having a first liquid intake connector and a first liquid outlet connector coupled to a flexible hose to distribute the heat removal liquid to the IT components. The first liquid intake connector and the first liquid outlet connector are capable of extending outwardly external to the server tray to connect to, and disconnect from, a second liquid intake connector and a second liquid outlet connector mounted on the liquid manifold, respectively. The quick-release coupling assembly can self-retract and be secure to a block holder when disconnected.

24 Claims, 10 Drawing Sheets

(56) References Cited

U.S. PATENT DOCUMENTS

| | | | |
|---|---|---|---|
| 2011/0313576 A1* | 12/2011 | Nicewonger | F28D 15/00 700/282 |
| 2013/0312846 A1* | 11/2013 | Eriksen | F16L 37/34 137/315.01 |
| 2014/0262180 A1* | 9/2014 | Lyon | H05K 7/20781 165/173 |
| 2015/0283658 A1* | 10/2015 | Ellsworth, Jr. | H02G 15/22 29/592.1 |
| 2016/0066480 A1* | 3/2016 | Eckberg | H05K 7/20772 361/679.53 |
| 2016/0113149 A1* | 4/2016 | Krug, Jr. | H05K 7/20781 361/679.53 |
| 2016/0242318 A1* | 8/2016 | Krug, Jr. | H05K 7/20772 |
| 2016/0341342 A1* | 11/2016 | Arvelo | H05K 7/20272 |
| 2017/0257980 A1* | 9/2017 | Fukunaga | H01R 13/005 |

* cited by examiner

MODULAR QUICK-RELEASE LIQUID HEAT REMOVAL COUPLING SYSTEM FOR ELECTRONIC RACKS

FIELD OF THE INVENTION

Embodiments of the present invention relate generally to data centers. More particularly, embodiments of the invention relate to a modular quick-release liquid heat removal coupling system for removing heat from electronic racks of IT components in a data center.

BACKGROUND

Heat removal is a prominent factor in computer system and data center design. The number of information technology (IT) components such as servers deployed within a data center has steadily increased as the server performance has improved, thereby increasing the amount of heat generated during the ordinary operation of the servers. The reliability of servers housed within a data center decreases if the environment in which they operate is permitted to increase in temperature over time. A significant portion of the data center's power is used for thermal management of electronics to maintain their proper operating thermal environment.

Direct liquid cooling for server is becoming a popular thermal management solution. In comparison with direct/indirect air cooling, direct liquid cooling enables server/rack with a higher heat density and removes heat with better power efficiency. For example, a typical indirect air cooling infrastructure requires chiller plants and Computer room air handler/conditioner units that consume a large portion of power running the chiller and/or fans units. A direct liquid cooling solution may provide the equivalent cooling capacity with less power needed while eliminating such a chiller unit. However, direct liquid cooling adds complicity to server and rack design, maintenance, ease of use, and deployment.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
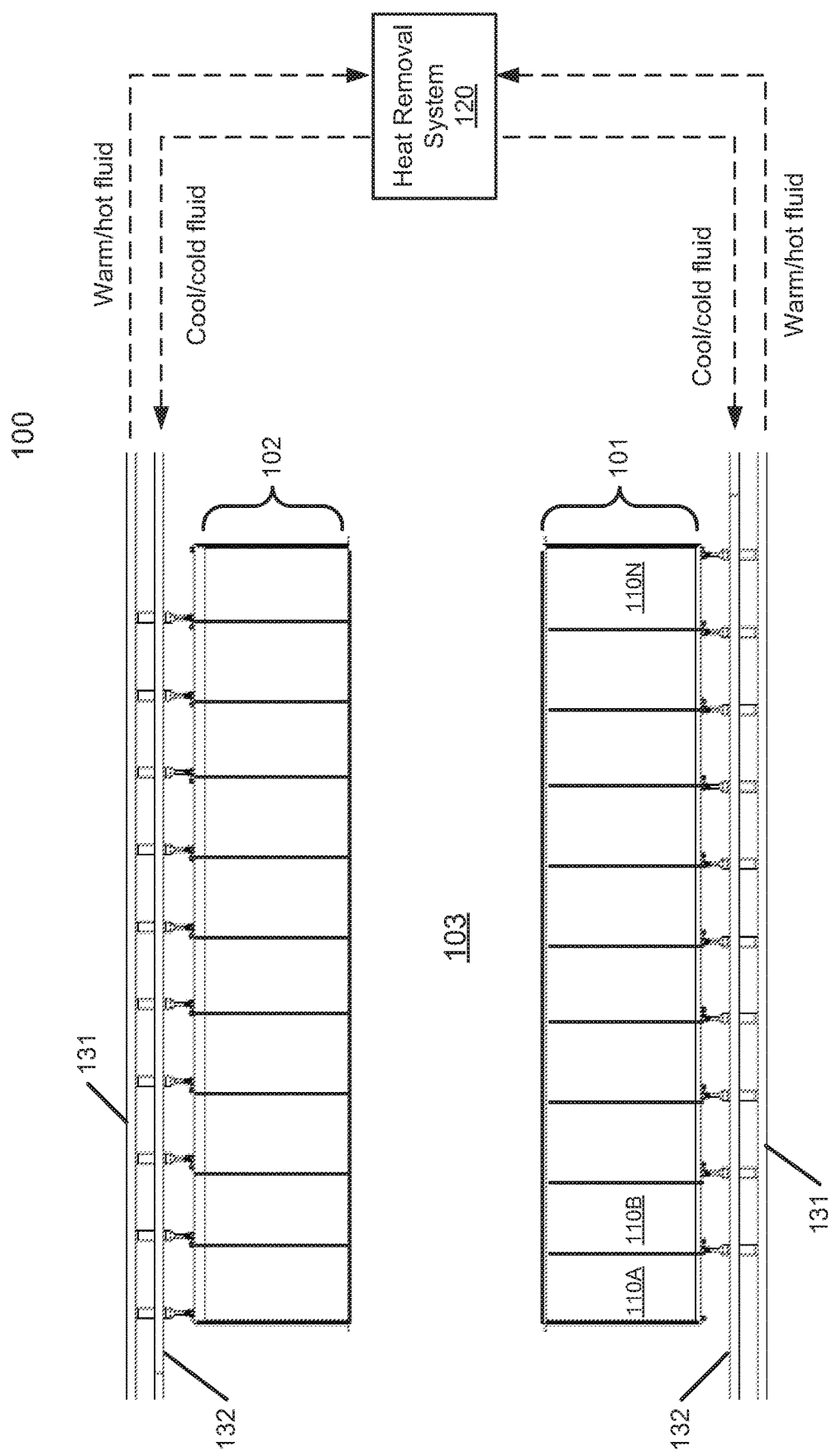
FIG. 1 is a block diagram illustrating a data center system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

One popular design for a liquid cooling infrastructure has dual liquid loops. The dual liquid loops design has a primary loop and a secondary loop. The primary loop is a facility loop. The secondary loop is a liquid cooling loop or internal loop. In some cases, the secondary loop consists of a coolant distribution unit (CDU), rack manifold, liquid piping, and cold plates. The CDU unit thermally connects the two loops without liquid being exchanged between the primary and the secondary loops. The liquid cold plates are attached to high performance chips or hardware of IT components, such as, but not limited to, central processing units (CPUs), graphical processing units (GPUs), memory, and hard drives. Liquid piping is required inside server housings for delivering fluid to the liquid cold plates.

A liquid cold plate typically includes a heat sink with a liquid pipe embedded or attached to the heat sink. A processor is then attached to a surface of the heat sink and the heat generated from the processor would be transferred to the heat sink. The cooling liquid flowing within the liquid pipe will exchange the heat carried by the heat sink. Rack manifold is installed and fixed to the rack while quick disconnects are installed on the manifold to connect the liquid piping. One design aspect for the secondary loop is a liquid line or liquid piping connection between the server and the rack manifold. The connection should be highly reliable, easy to operate, and should prevent normal wear and tear. In addition, the design should not impact sever transportation, system deployment, service and maintenance.

According to one aspect of the invention, an electronic rack includes a back panel, a number of server slots, and a number of server blades capable of being inserted into and removed from the server slots. Each server blade includes a processor, a memory, and/or a persistent storage device (e.g., hard disk), which represents a computer server. The backend of the electronic rack includes a heat removal liquid manifold assembly attached thereon to provide heat removal liquid from an external heat removal system (such as the CDU) to remove the heat from the server blades. Each server blade can be inserted and removed from a corresponding server slot from a frontend of the electronic rack. The heat removal liquid manifold may be disposed on different locations of the electronic rack. For example, the heat removal liquid manifold may be disposed on a front, a back, a top, a side, or a bottom panel of the electronic rack to provide heat removal liquid from an external heat removal system.

In one embodiment, each server blade includes a server tray to contain an information technology (IT) component representing the corresponding server and a quick-release coupling assembly having a first liquid intake connector and a first liquid outlet connector coupled to a flexible hose to distribute the heat removal liquid to the IT component. The first liquid intake connector is to receive heat removal liquid from the heat removal liquid manifold via the second liquid intake connector. The first liquid outlet liquid connector is to emit warmer or hotter liquid carrying the heat exchanged from the IT component to the heat removal liquid manifold assembly via the second liquid outlet connector, forming a secondary loop of a CDU associated with the electronic rack. The warmer/hot liquid then exchanges the heat with cooler liquid of a primary loop of the CDU. In one embodiment, the first liquid intake connector and the first liquid outlet connector are capable of extending outwardly external to the server tray to connect to, and disconnect from, a second liquid intake connector and a second liquid outlet connector fixedly disposed on the heat removal liquid manifold assembly respectively. According to another aspect of the invention, a data center includes a number of electronic racks. Each of the electronic racks includes a number of server blades.

FIG. 1 is a block diagram illustrating a data center system according to one embodiment of the invention. In this example, FIG. 1 shows a top view of at least a portion of a data center room. Referring to FIG. 1, according to one embodiment, data center system 100 includes rows of electronic racks of IT components, equipment or instruments 101-102, such as, for example, computer servers that provide data services to a variety of clients. In this embodiment, data center system 100 includes electronic racks arranged in row 101 and row 102 such as electronic racks 110A-110N. However, more or fewer rows of electronic racks may be implemented. Typically, rows 101-102 are aligned in parallel with frontends facing each other and backends facing away from each other, forming aisle 103 in between to allow an administrative person walking therein. However, other configurations or arrangements may also be applied.

In one embodiment, each of the electronic racks (e.g., electronic racks 110A-110N) includes a heat removal liquid manifold, a number of server slots, and a number of server blades capable of being inserted into and removed from the server slots. Each server blade includes a processor, a memory, and/or a persistent storage device (e.g., hard disk), which represents a computer server. The heat removal liquid manifold assembly to provide heat removal liquid from an external heat removal system 120 or from a rack mounted CDU within each electronic rack to remove heat from the server blades. Each server blade can be inserted and removed from a corresponding server slot from a frontend of the electronic rack. Heat removal system 120 may be a CDU, or a liquid to liquid heat exchanger that connects to an external liquid loop connected to a cooling tower or a dry cooler external to the building. Alternatively, heat removal system 120 can include but are not limited to evaporative cooling, free air, rejection to large thermal mass, and waste heat recovery designs.

In one embodiment, each server blade includes a server tray to contain an information technology (IT) component representing the corresponding server and a quick-release coupling assembly having a first liquid intake connector and a first liquid outlet connector coupled to a flexible hose to distribute the heat removal liquid to the IT component. The first liquid intake connector is to receive heat removal liquid via a second liquid intake connector from a heat removal liquid manifold mounted on a backend of the electronic rack. The first liquid outlet liquid connector is to emit warmer or hotter liquid carrying the heat exchanged from the IT component to the heat removal liquid manifold via a second liquid outlet connector and then back to a CDU within the electronic rack or the heat removing system 120. In one embodiment, the first liquid intake connector and the first liquid outlet connector are capable of extending outwardly external to the server tray to connect to, and disconnect from, respectively, a second liquid intake connector and a second liquid outlet connector fixedly disposed on the heat removal liquid manifold assembly. In another embodiment, the flexible hose is a corrugated hose.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via supply line 131 back to heat removal system 120. Liquid supply lines 131-132 are referred to as data center liquid supply lines (e.g., global liquid supply lines), which supply heat removal liquid to all of the electronic racks of rows 101-102. The locations of liquid supply lines 131-132 can vary. For example, liquid supply lines 131-132 may be located in area 103.

According to one embodiment, each of the electronic racks includes a local CDU disposed within the electronic rack. The CDU includes a liquid-liquid heat exchanger. A primary loop of the heat exchanger is coupled to liquid supply line 132 and liquid return line 131 of the external heat removal system 120. A secondary loop of the heat exchanger is coupled to the liquid manifold of the electronic rack. The liquid manifold includes an array of pairs of liquid intake connectors and liquid outlet connectors coupled to a liquid supply manifold and a liquid return manifold, respectively. Each pair of the liquid intake connector and liquid outlet connector of the liquid manifold is coupled to a corresponding pair of a liquid intake connector and a liquid outlet connector of one of the server blades.

Figure 2:
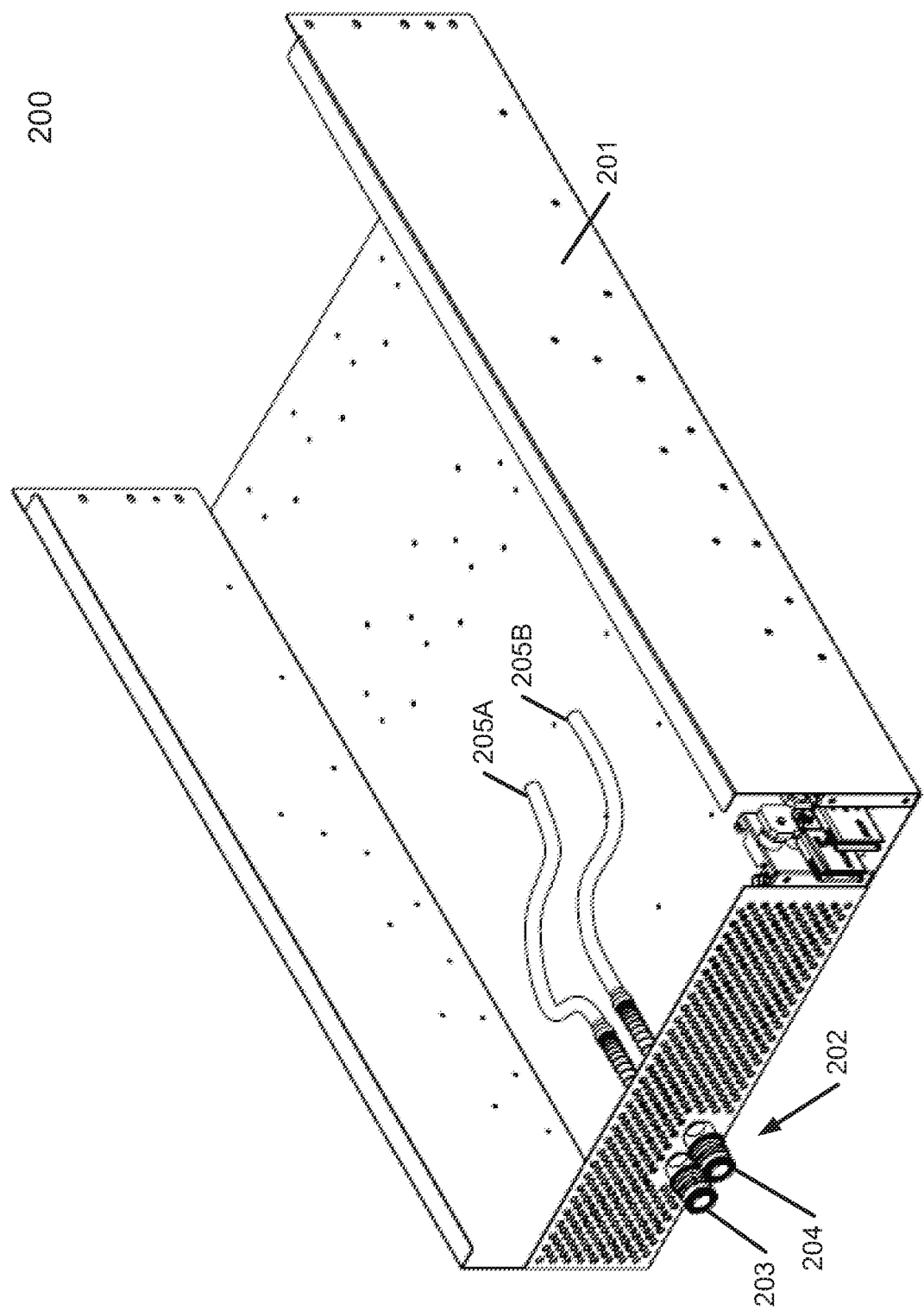
FIG. 2 shows a perspective view of a server blade according to one embodiment of the invention.

FIG. 2 shows a perspective view of a server blade according to one embodiment of the invention. Referring to FIG. 2, server blade 200 may represent any of the server blades of any of electronic racks 110A-110N of FIG. 1. An example of any of electronic racks 110A-110N is shown in FIGS. 7A-7B and 8A-8B, which will be described in details further below. In one embodiment, server blade 200 includes server tray or server chassis 201 to contain IT components therein (not shown), which can be processors, memory, and/or persistent storage devices, or any other components that may be reasonably included as a part of a computer server. Server blade 200 further includes a quick-release coupling assembly 202 having a pair of liquid connectors 203-204 to be coupled to a counterpart pair of liquid connectors mounted on a heat removal liquid manifold assembly mounted on a server rack (not shown).

Liquid connectors 203-204 are coupled to a first end and a second end of a liquid distribution tubes or pipes or hoses 205A and 205B, collectively referred to as tube 205. Liquid distribution tube 205 is to distribute the heat removal liquid to the IT component at various locations within the server blade, where the heat removal liquid exchanges the heat generated from the IT component. For the purpose of illustration, liquid connector 203 is a liquid intake connector to receive heat removal liquid from the heat removal liquid manifold assembly. The heat removal liquid is then carried through the liquid distribution tube 205 to remove heat from the IT component. Liquid connector 204 is a liquid outlet connector to emit the warmer or hotter liquid carrying the exchanged heat back to the heat removal liquid manifold assembly. In another embodiment, the connectors 203-204 may be reversed.

In one embodiment, connector 203 is coupled to a near end of tube 205A and connector 204 is coupled to a near end of tube 205B. A far end of tube 205A is coupled to a liquid intake end of a liquid distribution channel of a liquid cold plate on which a processor is attached (not shown). A far end of tube 205B is coupled to a liquid outlet end of the liquid distribution channel of the liquid cold plate. As a result, the heat removal liquid can be supplied to the liquid distribution channel of the liquid cold plate to remove at least a portion of the heat.

Figure 3B:
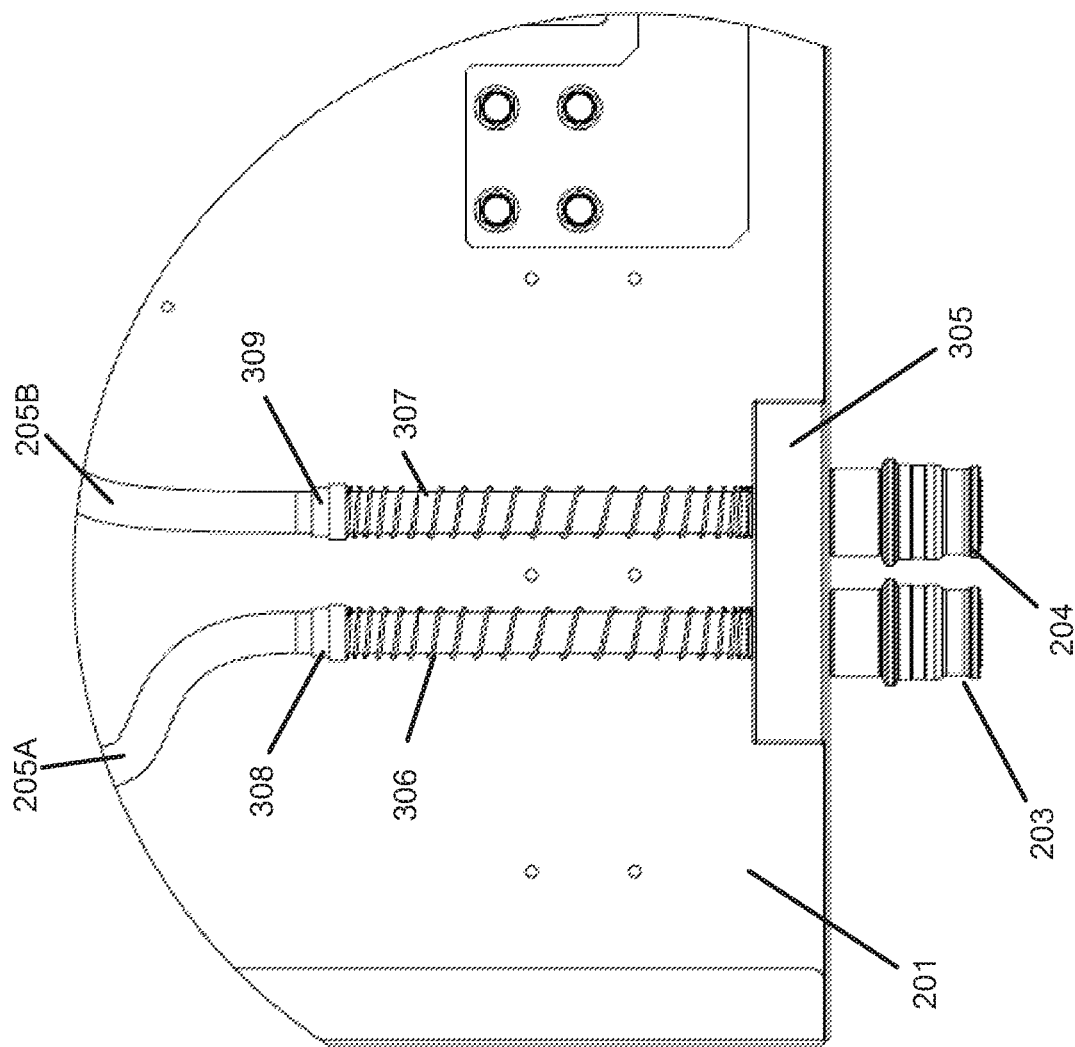
FIGS. 3A-3B shows a top view of a server blade according to one embodiment of the invention.
Figure 3A:
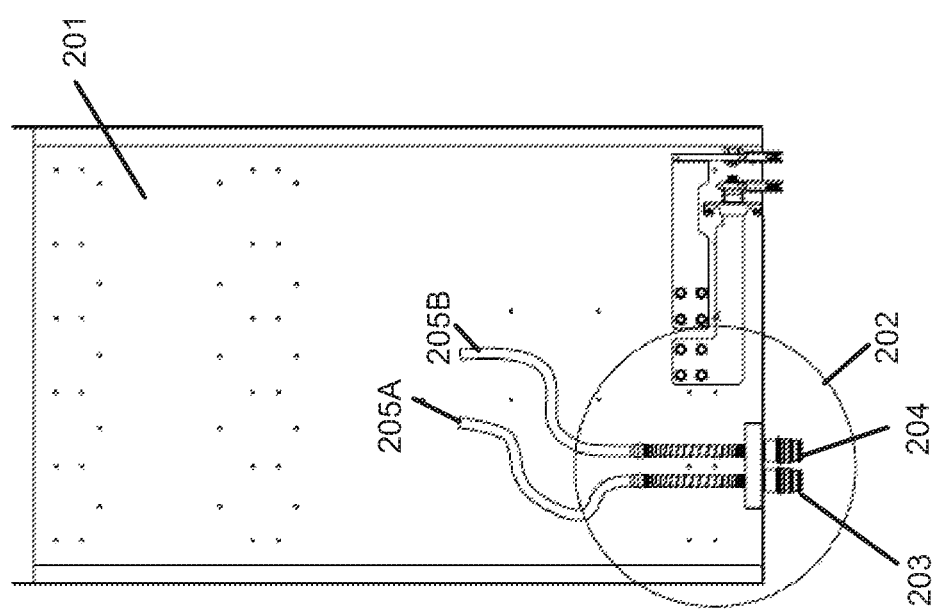

FIGS. 3A-3B shows a top view of a server blade according to one embodiment of the invention. FIGS. 3A-3B may be a top view of FIG. 2. Referring to FIGS. 3A-3B, quick-release coupling assembly 202 includes block holder 305, stopper rings 308-309 attached at a predetermined length from two distal ends of flexible hose 205, and springs 306-307 each wrapped around flexible hose 205 between block holder 305 and stopper rings 308-309, respectively. For example, spring 306 is situated between stopper ring 308 and block holder 305 to self-retract flexible hose 205 into server tray 201 when liquid intake connector 203 (first liquid intake connector) is released or disconnected.

In one embodiment, when connectors 203-204 are pulled away from server tray 201, springs 306-307 are pushed by stopper rings 308-309 and compressed respectively. Due to the flexibility of tubes 205A-205B, connectors 203-204 can turn to a variety of direction or angles to connect with the corresponding connector counterparts of the liquid manifold, which can be positioned in a variety of locations or orientations within the electronic rack. When coupling assembly is released or disconnected, compressed springs 306-307 expand to push the respective stopper rings 308-309 inwardly (e.g., away from block holder 305) to automatically retract liquid intake connector 203 and/or liquid outlet connector 204. The block holder is mounted on a back panel of server tray 201. A connected connector refers to a liquid intake or liquid outlet connectors connected to a liquid manifold assembly mounted on a server rack. A disconnected connector refers to a liquid intake or liquid outlet connector disconnected from a liquid manifold assembly mounted on a server rack, but attached to block holder 305.

Figure 4B:
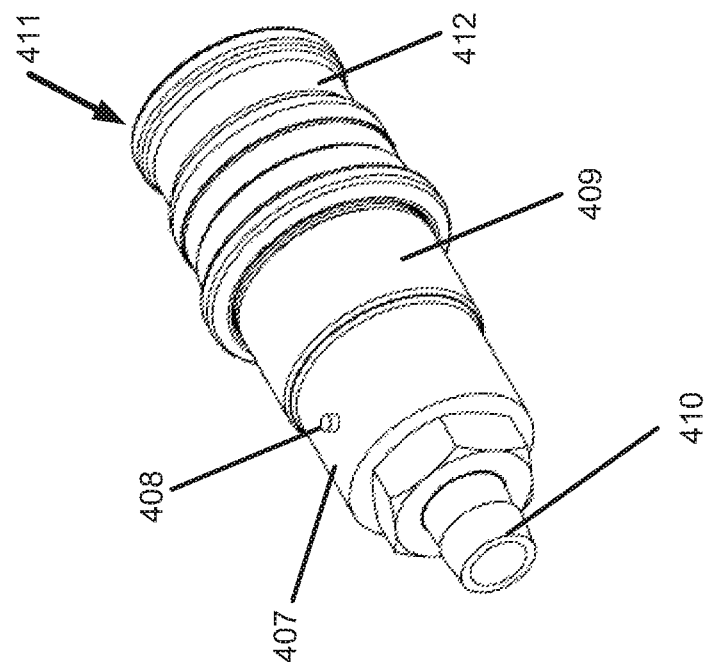
FIG. 4B shows a perspective view of a liquid intake connector or liquid outlet connector according to one embodiment of the invention.
Figure 4A:
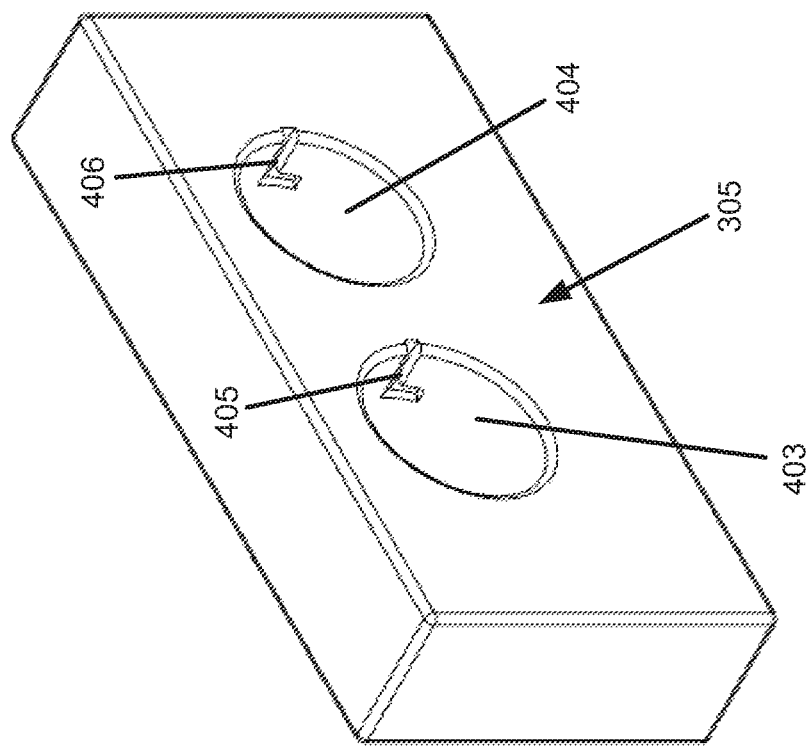
FIG. 4A shows a perspective view of a block holder according to one embodiment of the invention.

FIG. 4A shows a perspective view of a block holder according to one embodiment of the invention. FIG. 4B shows a perspective view of a liquid intake connector or liquid outlet connector according to one embodiment of the invention. Connector 411 of FIG. 4B may be liquid intake connector 203 or liquid outlet connector 204 of FIGS. 3A-3B. Referring to FIG. 4A, block holder 305 includes holes 403-404. Holes 403-404 have diameters large enough so that a flexible hose, such as hose 205 of FIGS. 3A-3B, can pass through, but small enough so that a connector connected to hose 205, such as liquid intake connector 203 and liquid outlet connector 204, cannot pass through.

In another embodiment, the diameter of stopper rings, such as stopper rings 308-309 of FIGS. 3A-3B, is greater than the diameter of holes 403-404 to stop flexible hose 205 from extending outwardly beyond a predetermined length. For example, liquid intake connector 203 and liquid outlet connector 204 can only extend outwardly from server tray 201 up to a predetermined length defined by stopper rings 308-309. Hose 205 may have reserved hose of a predetermined length equal to a distance between block holder holes 403-404 to stopper rings, such as stopper rings 308-309 of FIGS. 3A-3B, minus a length of a spring when it is compressed, such as springs 306-307 of FIGS. 3A-3B when compressed.

In one embodiment, the quick-release assembly includes a locking mechanism to lock connectors to a block holder when the connectors of the quick-release assembly are disconnected. In one embodiment, L-Shaped slots 405-406 are disposed on an inner surface of holes 403-404 as a locking mechanism for a protruding pin of a connector (also referred to as a locking pin), such as pin 408 of connector 411 of FIG. 4B, to slide in and lock to block holder 305. In another embodiment, holes 403-404 includes ball bearings (not shown) to prevent wear and tear on flexible hose 205. In another embodiment, holes 403-404 are coated with a rubbery material to prevent wear and tear on flexible hose 205. In another embodiment, holes 403-404 are coated with Teflon.

Referring to FIG. 4B, in one embodiment, connector 411 includes first section 409 and second section 407, such that a diameter of the outer edge of the first section 409 is greater than a size of holes 403-404 to prevent the connector from completely retracting inside a server tray. In another embodiment, second section 407 includes locking pin 408 disposed thereon to lock onto an L-shaped slot, such as slots 405-406 of FIG. 4A with a twisting or turning motion when the connector 411 is disconnected from a liquid manifold assembly. In one embodiment, when connector 411 is released from the liquid manifold (e.g., liquid manifold 713 of FIG. 7B), hose fitting barb end 410 can be retracted into any of holes 403 and 404.

In one embodiment, the diameter of holes 403 and 404 is slightly larger than the diameter of section 407. However, due to locking pin 408 disposed on section 407 and protruding upwardly, section 407 will be blocked by locking pin 408. In order to retract the entire section 407, locking pin 408 has to be aligned with a longer section of L-shaped slot 406 and slide inwardly therein. When locking pin 408 reaches the right turning corner of the L-shaped slot, connector 411 can be locked onto block holder 305 by turning section 407, in this example, in a clockwise direction so that locking pin 408 can slide into a shorter section of L-shaped slot 406. While in the locked position, the shorter section of the L-shape slot prevents by blocking locking pin 408 from being pulled outwardly away from block holder 305. The locking mechanism eases server transportation and deployment. In another embodiment, connector 411 includes a quick-release socket end 412 and a hose fitting barb end 410. The quick release socket end 412 may be a female socket of a quick-release pair connecting to a male socket such that the male socket is mounted on a rack liquid manifold. In another embodiment, the hose fitting bard end 410 has a barbed surface. In another embodiment, the hose fitting bard end 410 is threaded.

Figure 5:
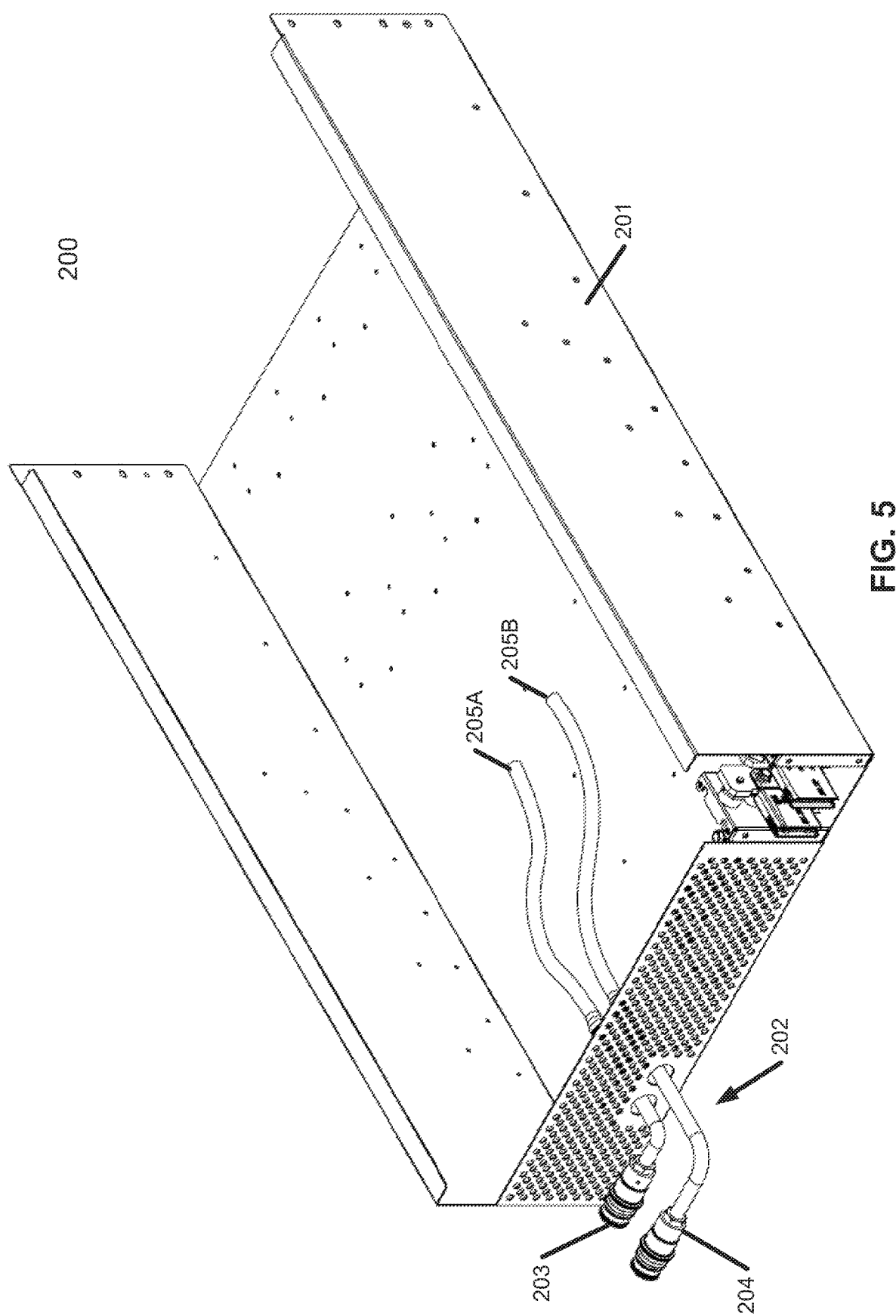
FIG. 5 shows a perspective view of a server blade when connectors are connected to a rack manifold according to one embodiment of the invention.
Figure 6B:
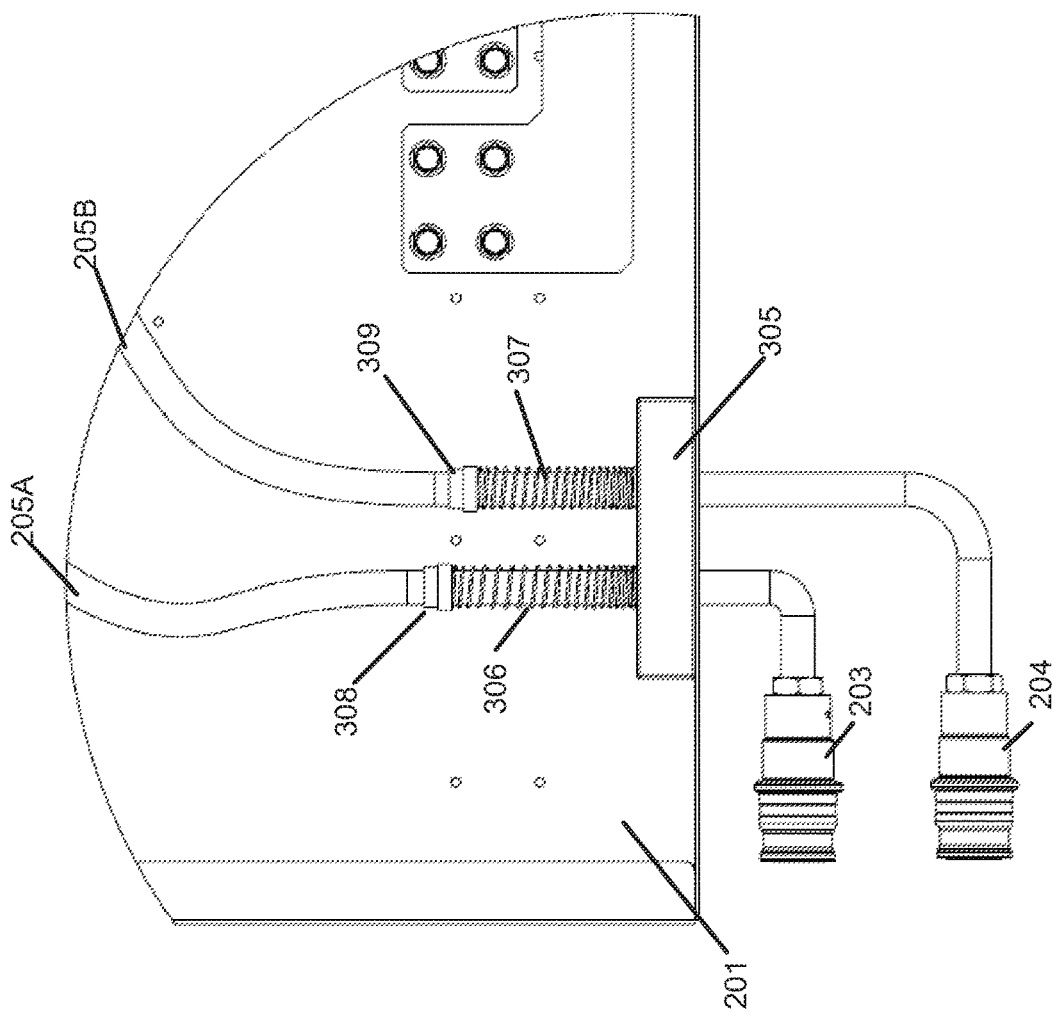
FIGS. 6A-6B shows a top view of a server blade having connectors connected to a rack manifold according to one embodiment of the invention.
Figure 6A:
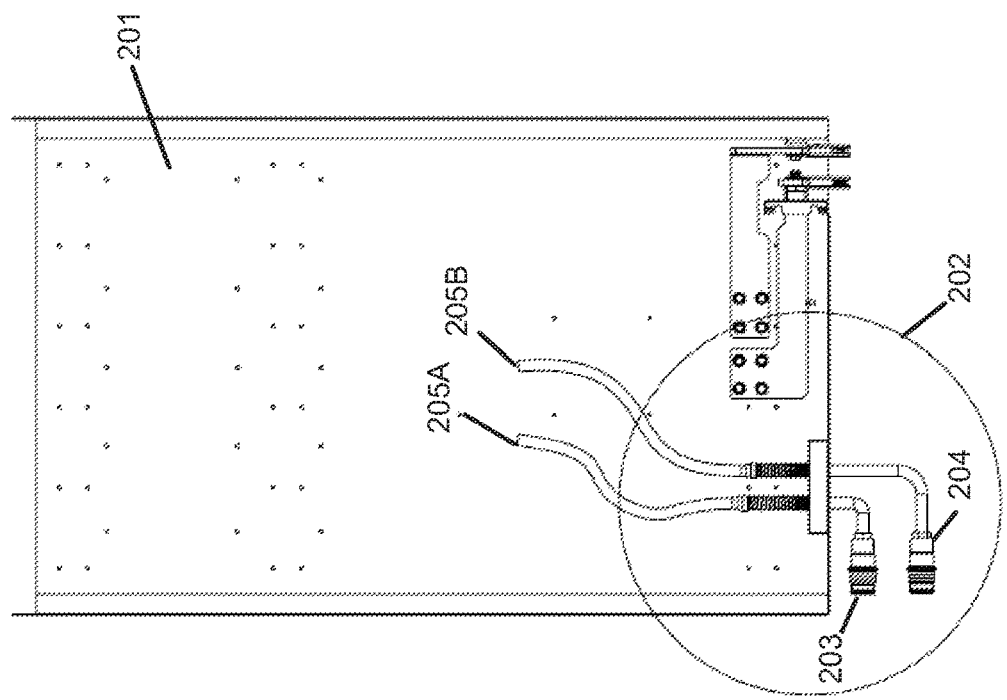

FIG. 5 shows a perspective view of server blade 200 having connectors connected to a rack manifold according to one embodiment of the invention. FIGS. 6A-6B show a top view of server blade 200 having connectors connected to a rack manifold according to one embodiment of the invention. FIGS. 6A-6B may represent a top view of FIG. 5. Referring to FIGS. 6A-6B, when liquid intake connector 203 and/or liquid outlet connector 204 is pulled outwardly away from server tray 201, the respective stopper rings 308-309 pushes and compresses the respective springs 306-307 against block holder 305. Once connectors 203-204 are pulled outwardly away from server tray 201, due to the flexibility of the hoses, connectors 203-204 can turn to any direction or angle, for example to connect with liquid manifold mounted on the electronic rack as shown on FIG. 8A.

In this example, the liquid manifold is mounted on the side of the backend. Connectors 203-204 can be pulled and turned in an angle to connect with the corresponding connector counterparts of the liquid manifold. In another embodiment, a diameter of springs 306-307 is greater than a diameter of holes of block holder 305, such as holes 403-404 of FIG. 4A, and a diameter of springs 306-307 is smaller than a diameter of stopper ring 308-309 such that springs 306-307 can be compressed between block holder 305 and respective stopper rings 308-309. When connectors 203-204 are released, the corresponding springs 306-307 expand to automatically retract hoses back into server tray 201.

Figure 7A:
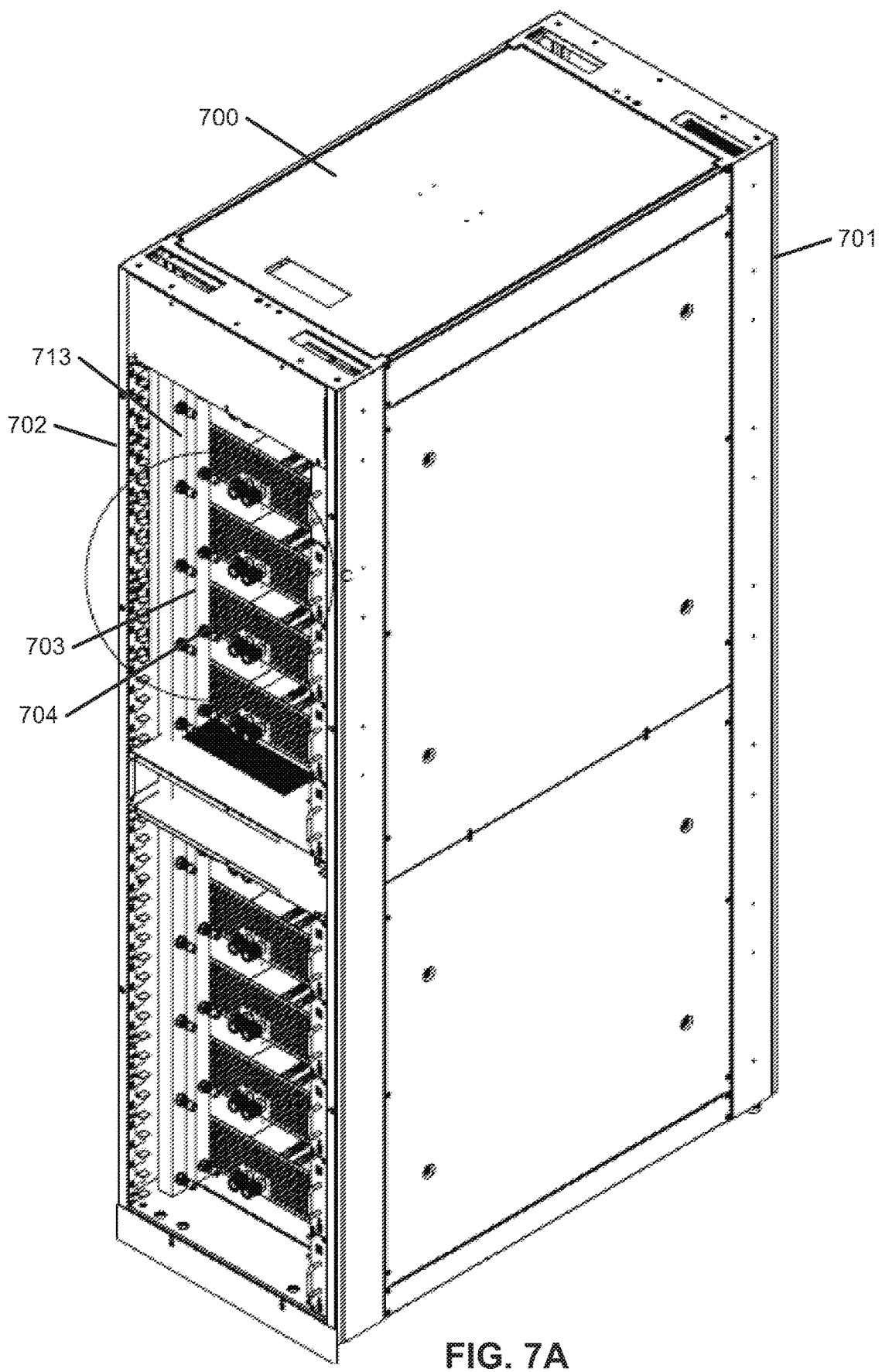
FIGS. 7A-7B shows a perspective view of a backend of an electronic rack according to one embodiment of the invention.
Figure 7B:
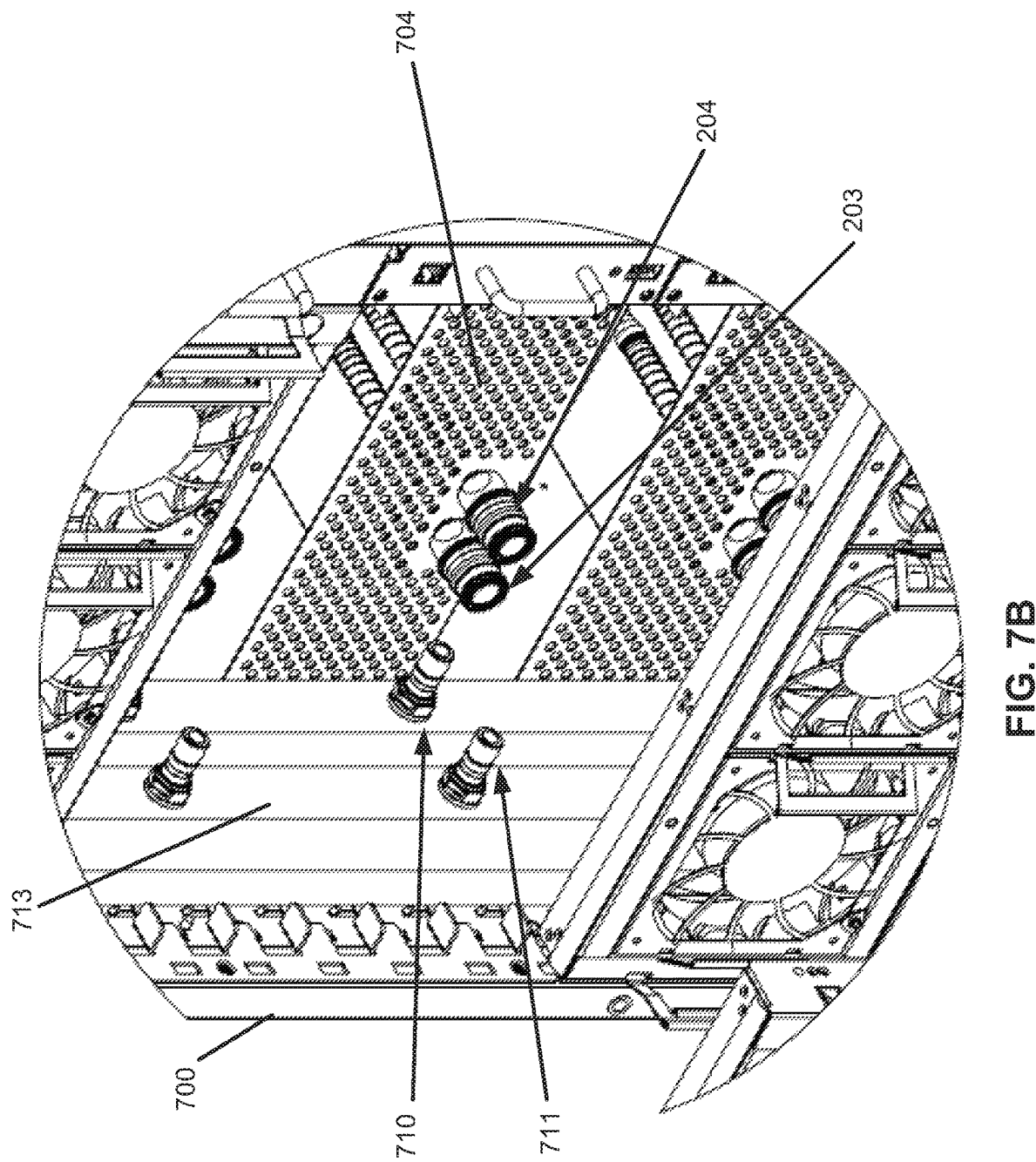
Figure 8A:
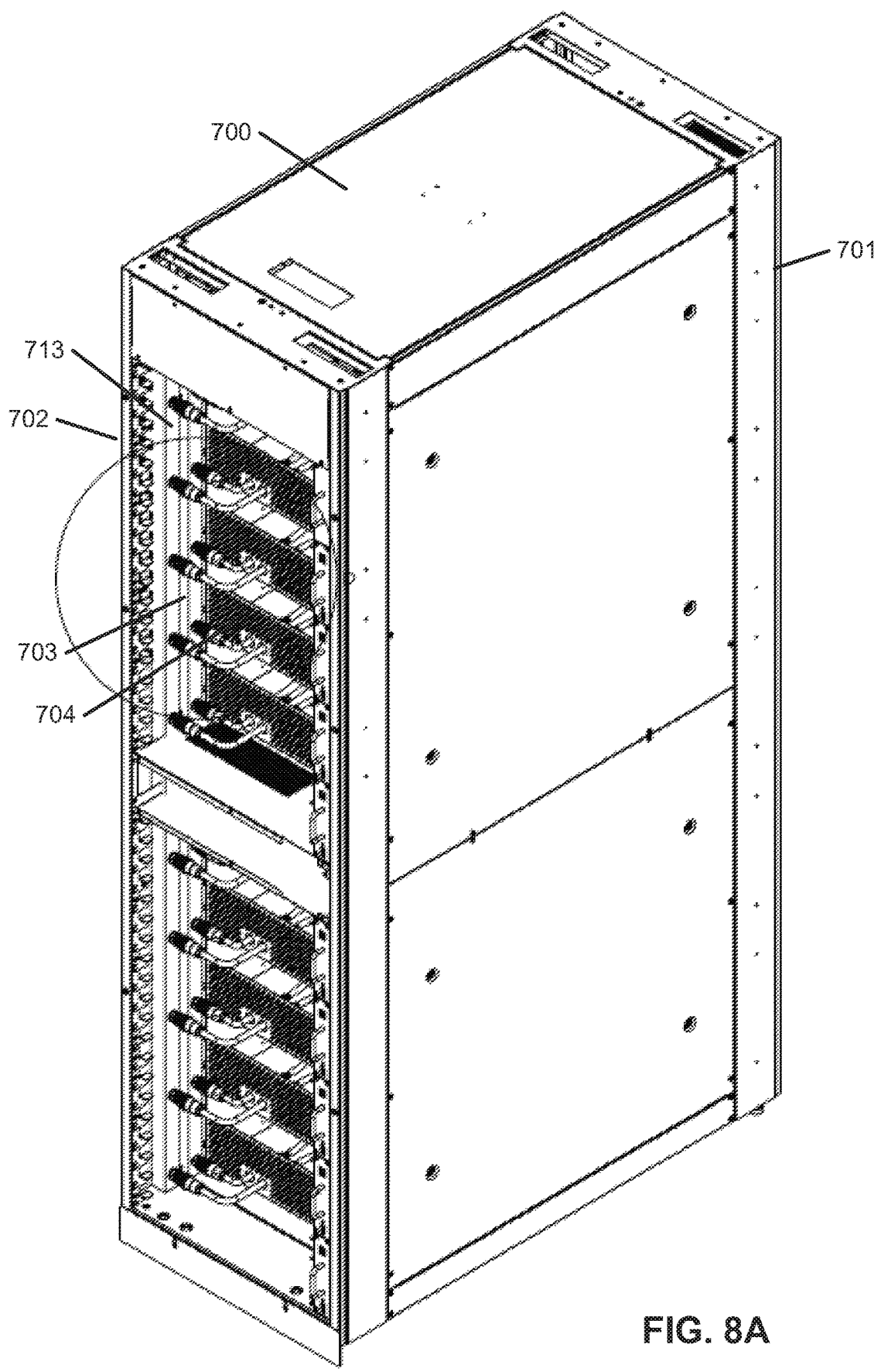
FIGS. 8A-8B shows a perspective view of a backend of an electronic rack having respective connectors connected to a rack manifold according to one embodiment of the invention.
Figure 8B:
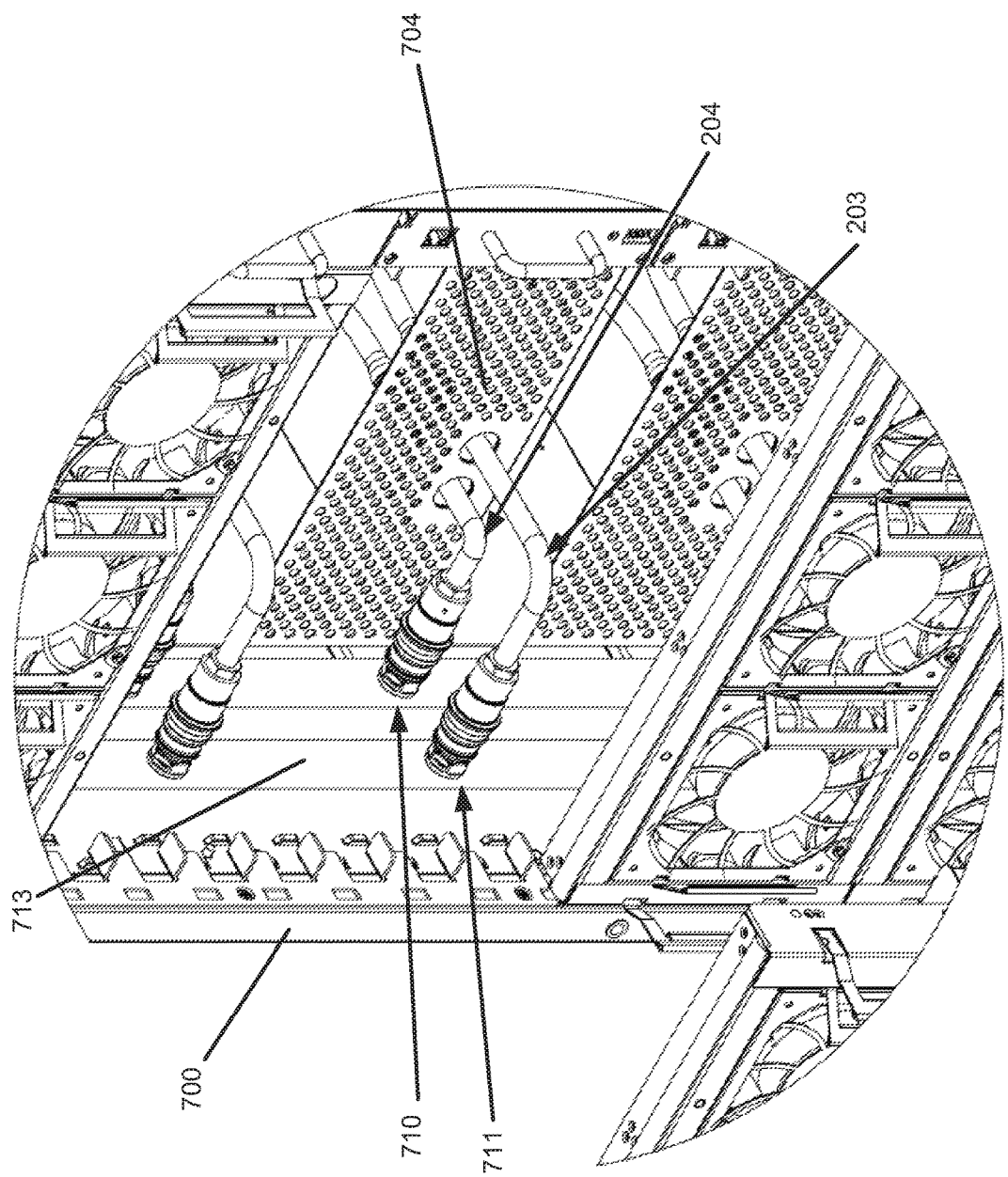

FIGS. 7A-7B shows a perspective view of a backend of an electronic rack according to one embodiment of the invention. FIGS. 8A-8B shows a perspective view of a backend of an electronic rack having respective connectors connected to a rack manifold according to one embodiment of the invention. The electronic racks shown in FIGS. 7A-7B and 8A-8B can represent any of the electronic racks as shown in FIG. 1. Referring to FIGS. 7A and 8A, electronic rack 700 includes a housing to house a number of sever slots such as server slot 703 to receive a server blade such as server blade 704. Electronic rack 700 includes frontend 701 and backend 702. Backend 702 includes a heat removal liquid manifold assembly 713. The heat removal liquid manifold may include a main liquid intake connector and a main liquid outlet connector (not shown), which can be coupled to liquid supply lines such as liquid supply lines 131-132 to receive heat removal liquid from a CDU within the electronic rack or an external heat removal system such as heat removal system 120 of FIG. 1.

According to one embodiment, for each of the server slots such as server slot 703, there is a pair of a liquid intake connector and a liquid outlet connector disposed on the heat removal liquid manifold 713. For example, liquid intake connector 203 of server blade 704 includes a respective liquid intake connector 710 of liquid manifold 713. Liquid outlet connector 204 of server blade 704 includes a respective liquid outlet connector 711 of liquid manifold 713.

Referring to FIGS. 8A-8B, when sever blade 704 is inserted into server slot 703, liquid intake connector 203 and liquid outlet connector 204 may extend outwardly to couple to respective liquid intake connector 710 and liquid outlet connector 711 of liquid manifold 713. Liquid intake connector 203 and liquid outlet connector 204 may be retracted when disconnected and they may lock to a block holder via a locking mechanism as described above.

Note that the heat removal techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
   a heat removal liquid manifold assembly to provide heat removal liquid from an external heat removal system, the heat removal liquid manifold assembly disposed on a backend of the electronic rack; and
   a plurality of server blades contained in a plurality of server slots via a frontend of the electronic rack, wherein each of the server blades comprises
   a server tray to contain an information technology (IT) component representing a corresponding server therein, and
   a quick-release coupling assembly having a first liquid intake connector and a first liquid outlet connector coupled to a flexible hose to distribute the heat removal liquid to the IT component, the first liquid intake connector to receive the heat removal liquid from the heat removal liquid manifold assembly to remove heat from the IT component, the first liquid outlet connector to emit warmer liquid carrying heat exchanged from the IT component to the heat removal liquid manifold assembly, wherein the first liquid intake connector, the first liquid outlet connector, and the flexible hose extend outwardly external to the server tray to connect to a second liquid intake connector and a second liquid outlet connector fixedly disposed on the heat removal liquid manifold assembly, respectively, and when the first liquid intake connector and the first liquid outlet connector are disconnected from the second liquid intake connector and the second liquid outlet connector, respectively, springs within the server tray cause the first liquid intake connector and the first liquid outlet connector to automatically retract to the server tray such that the entire flexible hose retracts inside the server tray.

2. The electronic rack of claim 1, wherein the quick-release coupling assembly comprises a block holder having a first and a second holes with circumferences large enough so that the flexible hose coupled to the first liquid intake connector and the first liquid outlet connector can pass through, but small enough so that the first liquid intake connector and the first liquid outlet connector cannot pass through.

3. The electronic rack of claim 2, wherein each of the first liquid intake connector and the first liquid outlet connector comprises:
    a stopper ring attached to a predetermined length of the flexible hose; and
    one of the springs wrapped around the flexible hose and situated between the stopper ring and the block holder to self-retract the flexible hose into the server tray when the corresponding one of the first liquid intake connector or the first liquid outlet connector is released.

4. The electronic rack of claim 3, wherein a diameter of the stopper ring is greater than a diameter of the first and second holes to stop the flexible hose from further expending after the predetermined length.

5. The electronic rack of claim 2, wherein each of the first liquid intake connector and/or the first liquid outlet connector includes a locking mechanism such that the first liquid intake connector and/or the first liquid outlet connector can lock on to the block holder when the quick-release coupling assembly is disconnected.

6. The electronic rack of claim 5, wherein the locking mechanism comprises:
    a first locking pin protruding on a surface of the first liquid intake connector;
    a second locking pin protruding on a surface of the first liquid outlet connector; and
    a first and a second L-shaped slots disposed on an inner surface of the first and second holes of block holder such that the first liquid intake connector and/or the first liquid outlet connector can slide in and out of the first and second holes of block holder, respectively, while the first and second locking pins slide along the L-shaped slots, respectively, wherein the first liquid intake connector and/or the first liquid outlet connector can lock on to the first and/or second holes of block holder with a twisting motion, respectively.

7. The electronic rack of claim 6, wherein each of the first liquid intake connector and the first liquid outlet connector includes a first section and a second section, the second section having the first pin or the second pin disposed thereon, wherein a size of the first section is greater than a size of the first and second holes to prevent the flexible hose from being completely retracted inside the server tray.

8. The electronic rack of claim 3, wherein, when the first liquid intake connector and/or first liquid outlet connector is pulled outwardly away from the server tray, the respective stopper ring pushes and compresses the respective spring against the block holder.

9. The electronic rack of claim 8, wherein a diameter of the respective spring is greater than a diameter of the first and second holes of the block holder, and wherein a diameter of the respective spring is smaller than a diameter of the stopper ring, such that the respective spring is compressed between the block holder and the stopper ring.

10. The electronic rack of claim 8, wherein, when the first liquid intake connector and/or the first liquid outlet connector is released, the respective compressed spring expands to push the respective stopper ring inwardly to retract the first liquid intake connector and/or the first liquid outlet connector.

11. A data center, comprising:
    a heat removal system to provide and reticulate heat removal liquid; and
    a plurality of electronic racks, each of the electronic racks including
        a heat removal liquid manifold assembly to provide heat removal liquid from an external heat removal system, the heat removal liquid manifold assembly disposed on a backend of the electronic rack; and
        a plurality of server blades contained in a plurality of server slots via a frontend of the electronic rack, wherein each of the server blades comprises
            a server tray to contain an information technology (IT) component representing a corresponding server therein, and
            a quick-release coupling assembly having a first liquid intake connector and a first liquid outlet connector coupled to a flexible hose to distribute the heat removal liquid to the IT component, the first liquid intake connector to receive the heat removal liquid from the heat removal liquid manifold assembly to remove heat from the IT component, the first liquid outlet connector to emit warmer liquid carrying heat exchanged from the IT component to the heat removal liquid manifold assembly, wherein the first liquid intake connector, the first liquid outlet connector, and the flexible hose extend outwardly external to the server tray to connect to a second liquid intake connector and a second liquid outlet connector fixedly disposed on the heat removal liquid manifold assembly, respectively, and when the first liquid intake connector and the first liquid outlet connector are disconnected from the second liquid intake connector and the second liquid outlet connector, respectively, springs within the server tray cause the first liquid intake connector and the first liquid outlet connector to automatically retract to the server tray such that the entire flexible hose retracts inside the server tray.

12. The data center of claim 11, wherein the quick-release coupling assembly comprises a block holder having a first and a second holes with circumferences large enough so that the flexible hose coupled to the first liquid intake connector and the first liquid outlet connector can pass through, but small enough so that the first liquid intake connector and the first liquid outlet connector cannot pass through.

13. The data center of claim 12, wherein each of the first liquid intake connector and the first liquid outlet connector comprises:
    a stopper ring attached to a predetermined length of the flexible hose; and
    one of the springs wrapped around the flexible hose and situated between the stopper ring and the block holder to self-retract the flexible hose into the server tray when the corresponding one of the first liquid intake connector or the first liquid outlet connector is released.

14. The data center of claim 13, wherein a diameter of the stopper ring is greater than a diameter of the first and second holes to stop the flexible hose from further expending after the predetermined length.

15. The data center of claim 12, wherein each of the first liquid intake connector and/or the first liquid outlet connector includes a locking mechanism such that the first liquid intake connector and/or the first liquid outlet connector can lock on to the block holder when the quick-release coupling assembly is disconnected.

16. The data center of claim 15, wherein the locking mechanism comprises:
    a first locking pin protruding on a surface of the first liquid intake connector;
    a second locking pin protruding on a surface of the first liquid outlet connector; and a first and a second L-shaped slots disposed on an inner surface of the first and second holes of block holder such that the first liquid intake connector and/or the first liquid outlet connector can slide in and out of the first and second holes of block holder, respectively, while the first and second locking pins slide along the L-shaped slots, respectively, wherein the first liquid intake connector and/or the first liquid outlet connector can lock on to the first and/or second holes of block holder with a twisting motion, respectively.

17. The data center of claim 16, wherein each of the first liquid intake connector and the first liquid outlet connector includes a first section and a second section, the second section having the first pin or the second pin disposed thereon, wherein a size of the first section is greater than a size of the first and second holes to prevent the flexible hose from being completely retracted inside the server tray.

18. A server blade of an electronic rack, comprising:
a server tray to contain an information technology (IT) component representing a corresponding server therein, and
a quick-release coupling assembly having a first liquid intake connector and a first liquid outlet connector coupled to a flexible hose to distribute the heat removal liquid to the IT component, the first liquid intake connector to receive the heat removal liquid from a heat removal liquid manifold assembly to remove heat from the IT component, the first liquid outlet connector to emit warmer liquid carrying heat exchanged from the IT component to the heat removal liquid manifold assembly, wherein the first liquid intake connector, the first liquid outlet connector, and the flexible hose extend outwardly external to the server tray to connect to a second liquid intake connector and a second liquid outlet connector fixedly disposed on the heat removal liquid manifold assembly, respectively, and when the first liquid intake connector and the first liquid outlet connector are disconnected from the second liquid intake connector and the second liquid outlet connector, respectively, springs within the server tray cause the first liquid intake connector and the first liquid outlet connector to automatically retract to the server tray such that the entire flexible hose retracts inside the server tray.

19. The server blade of claim 18, wherein the quick-release coupling assembly comprises a block holder having a first and a second holes with circumferences large enough so that the flexible hose coupled to the first liquid intake connector and the first liquid outlet connector can pass through, but small enough so that the first liquid intake connector and the first liquid outlet connector cannot pass through.

20. The server blade of claim 19, wherein each of the first liquid intake connector and the first liquid outlet connector comprises:
a stopper ring attached to a predetermined length of the flexible hose; and
one of the springs wrapped around the flexible hose and situated between the stopper ring and the block holder to self-retract the flexible hose into the server tray when the corresponding one of the first liquid intake connector or the first liquid outlet connector is released.

21. The server blade of claim 20, wherein a diameter of the stopper ring is greater than a diameter of the first and second holes to stop the flexible hose from further expending after the predetermined length.

22. The server blade of claim 19, wherein each of the first liquid intake connector and/or the first liquid outlet connector includes a locking mechanism such that the first liquid intake connector and/or the first liquid outlet connector can lock on to the block holder when the quick-release coupling assembly is disconnected.

23. The server blade of claim 22, wherein the locking mechanism comprises:
a first locking pin protruding on a surface of the first liquid intake connector;
a second locking pin protruding on a surface of the first liquid outlet connector; and
a first and a second L-shaped slots disposed on an inner surface of the first and second holes of block holder such that the first liquid intake connector and/or the first liquid outlet connector can slide in and out of the first and second holes of block holder, respectively, while the first and second locking pins slide along the L-shaped slots, respectively, wherein the first liquid intake connector and/or the first liquid outlet connector can lock on to the first and/or second holes of block holder with a twisting motion, respectively.

24. The server blade of claim 23, wherein each of the first liquid intake connector and the first liquid outlet connector includes a first section and a second section, the second section having the first pin or the second pin disposed thereon, wherein a size of the first section is greater than a size of the first and second holes to prevent the flexible hose from being completely retracted inside the server tray.

* * * * *